(12) United States Patent
Price

(10) Patent No.: US 7,299,143 B2
(45) Date of Patent: Nov. 20, 2007

(54) METHOD AND APPARATUS FOR IMPROVING OPERATIONAL RELIABILITY DURING A LOSS OF A PHASE VOLTAGE

(75) Inventor: Elmo Price, Dawsonville, GA (US)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 11/432,904

(22) Filed: May 12, 2006

(65) Prior Publication Data

US 2006/0276979 A1     Dec. 7, 2006

Related U.S. Application Data

(60) Provisional application No. 60/680,719, filed on May 13, 2005.

(51) Int. Cl.
*G06F 19/00*     (2006.01)

(52) U.S. Cl. .............................. 702/64; 702/59; 702/58; 702/66; 324/521; 324/522; 361/78; 361/80; 361/42; 361/85

(58) Field of Classification Search ................ 702/58, 702/59, 64, 66; 324/509, 512, 521, 522, 324/524, 525, 532, 533, 534; 361/42, 62, 361/67, 58, 88, 78, 80, 85
See application file for complete search history.

(56) References Cited

U.S. PATENT DOCUMENTS

| | | | | |
|---|---|---|---|---|
| 3,825,815 A | * | 7/1974 | Gyugyi et al. ............... | 307/105 |
| 4,063,300 A | * | 12/1977 | Paddison et al. ............. | 361/78 |
| 4,314,199 A | * | 2/1982 | Yamaura et al. ............. | 324/521 |
| 4,420,788 A | * | 12/1983 | Wilkinson et al. ............ | 361/85 |
| 4,591,992 A | * | 5/1986 | Yamaura ...................... | 702/59 |
| 4,719,580 A | * | 1/1988 | Nimmersjo .................. | 702/59 |
| 4,823,226 A | * | 4/1989 | Reed et al. ................... | 361/85 |
| 5,694,281 A | * | 12/1997 | Roberts et al. ............... | 361/80 |
| 5,883,578 A | * | 3/1999 | Roberts et al. ............. | 340/661 |
| 6,466,030 B2 | * | 10/2002 | Hu et al. ...................... | 324/522 |
| 6,914,762 B2 | * | 7/2005 | Bo ................................ | 361/62 |
| 2002/0121903 A1 | * | 9/2002 | Hu et al. ..................... | 324/522 |
| 2002/0149375 A1 | * | 10/2002 | Hu et al. ..................... | 324/522 |
| 2003/0142450 A1 | * | 7/2003 | Bo ................................ | 361/62 |
| 2004/0167729 A1 | * | 8/2004 | Saha et al. ................... | 702/58 |
| 2006/0142964 A1 | * | 6/2006 | Saha et al. ................... | 702/66 |

\* cited by examiner

*Primary Examiner*—Carol S. W. Tsai
(74) *Attorney, Agent, or Firm*—Michael M. Rickin; Michael C. Prewitt

(57) ABSTRACT

The present invention is directed to a method and apparatus for improving operational reliability during a loss of a phase voltage (LOV) in a multi-phase power system, wherein a voltage representative of the LOV phase is calculated. The representative voltage is used for computing a reference polarizing voltage suitable for a protection unit.

19 Claims, 3 Drawing Sheets

METHOD AND APPARATUS FOR IMPROVING OPERATIONAL RELIABILITY DURING A LOSS OF A PHASE VOLTAGE

CROSS REFERENCE TO RELATED APPLICATION

This application claims the priority of U.S. provisional patent application Ser. No. 60/680,719 filed on May 13, 2005, entitled "A METHOD FOR IMPROVING OPERATIONAL RELIABILITY DURING A LOSS OF SINGLE PHASE VOLTAGE" the contents of which are relied upon and incorporated herein by reference in their entirety, and the benefit of priority under 35 U.S.C. 119(e) is hereby claimed.

BACKGROUND OF THE INVENTION

The present invention relates to a multi-phase power system and in particular to the reliability of that system during a loss of phase voltage.

As widely known in the art, many protective devices, such as relays, circuit breakers, various types of monitoring, supervising and fault detection units, are used in power system. One basic task of these devices is to allow electrical power to be distributed in a reliable manner and to adequately protect either the transmission lines and the loads or equipments connected therewith, e.g. generators, motors, from hazardous conditions which could lead to malfunction, severe damage, failure, etc.

Often, the protection of power system elements is based on accurate measurement of three-phase voltages in order to provide reliable fault detection and breaker operations and thus minimize power system disruptions. In these cases, incorrectly measuring one or more of the three-phase voltages by a protective unit may result in technical shortcomings, e.g. erroneous trips (breaker operations) and/or clearing more of the power system than desired.

For example a common failure that causes incorrect voltage measurement is when there is a downed line, or due to an equipment failure in an end-user's facility, or when one or more fuses protecting a three-phase voltage transformer (VT) secondary circuit blow. In the latter case, protective relays connected to that secondary circuit would measure zero voltage if a secondary phase is isolated (only phase-to-ground connections) or there exist a non-zero coupled value if there are phase-to-phase connections in the secondary circuit. Conditions, other than blown fuses, may also occur where one or more secondary phase voltages are unintentionally removed from the protective relay.

In the electrical power system industry operating in this abnormal state may for example be referred to as "single-phasing", or as fuse failure, or as "loss-of-potential (LOP)", or more commonly as "loss-of-voltage (LOV)" and this last definition ("LOV") will be used hereinafter to refer to the loss of voltage in a single phase.

It is clear that when an LOV state occurs, adequate control of voltage dependent measuring units need to be carried out so as to reduce potential detrimental effects on the whole power system and/or on the various pieces of equipment.

For example, with protection measuring units, such as distance and impedance units, e.g. distance relays, functioning is based on calculating the impedance seen by the units themselves; since the impedance measured is directly dependent on the voltage(s). Thus an LOV condition will adversely affect obtaining correct measurements and therefore missing one or more phase voltages will lead to misoperations, such as untimely tripping.

The same considerations apply also in the case of the so-called directional units, i.e. protection measuring devices that determine the direction of the current flow in an AC circuit and are used to supervise for example an overcurrent relay in order to let it trip only in the desired direction. These directional units can perform their supervision task by comparing the angular relationship between the current in the protected circuit and an independent voltage source. Since the current can vary significantly for various types of faults, in order to determine directionality the independent voltage may be used as a reference or polarizing quantity. This reference voltage may be not correct during an LOV state, and hence the directional units will not be able to provide the required supervision and may contribute to a misoperation.

A further example of the negative impact that the occurrence of an LOV state may have on power line protection is the operation of a recloser. A recloser opens and closes multiple times when a fault condition exists in an attempt to clear the fault. Should the fault condition continue to exist, the recloser opens and remains open until reset manually. The recloser enters a "lock out" state when this occurs. Automatic reclosing requires synchronization or comparison of voltage on each side of an open line circuit breaker. These comparisons are often accomplished by comparing the voltage from one phase VT on each side of the open breaker. If an LOV condition exists on either VT, reclosing may operate incorrectly and prevent automatic system restoration, cause a line outage, or possibly cause circuit breaker damage. Thus, the location of the LOV may impact the protection functions provided by the recloser.

In the past, in order to improve reliability under an LOV state, various solutions have been devised varying depending on several aspects of the specific applications, such as type, number and technology of protecting systems, available options provided by the units, architecture of the power system, etc. These known solutions, even though providing some improvements may not be entirely satisfactory as they may, when an LOV condition occurs, either give rise to false trip or not allow for local fault clearing, or require the use of costly redundant protection system.

Thus it is desirable to provide a solution which improves operational reliability during an LOV state.

SUMMARY OF THE INVENTION

In accordance with the present invention, a method for improving operational reliability during a loss of a phase voltage in a multi-phase power system, in particular a three-phase power line, is provided. In accordance with the method, when one of the phases is under an LOV state, a fictitious voltage representative of this LOV state phase is calculated and a reference polarizing voltage is computed suitable for any protection unit associated with the power system. The invention also provides a multi-phase power system, such as a three-phase power line, for allowing operational reliability during a loss of a phase voltage (LOV), comprising a computing device having therein program code usable by the computing device itself, wherein the program code comprises code configured to: identify the phase which is in an LOV state; calculate a fictitious voltage representative of the voltage of said phase in an LOV state; and calculate a reference polarizing voltage. Further, the present invention also provides a computer program product for allowing reliable operation during a loss of a phase voltage (LOV) in a multi-phase power system, wherein the computer program product comprises computer usable program code which is configured to: identify the phase which is in an LOV state; then to calculate a fictitious voltage representative of the voltage of said phase in an LOV state; and finally to calculate a reference polarizing voltage.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

It should be noted that in order to clearly and concisely disclose the present invention, the drawings may not necessarily be to scale and certain features of the invention may be shown in somewhat schematic form.

In the following description and illustrative examples, the method according to the present invention is described by making particular reference to its functioning with directional protection units without intending in any way to limit its scope and potential field of application.

Figure 1:
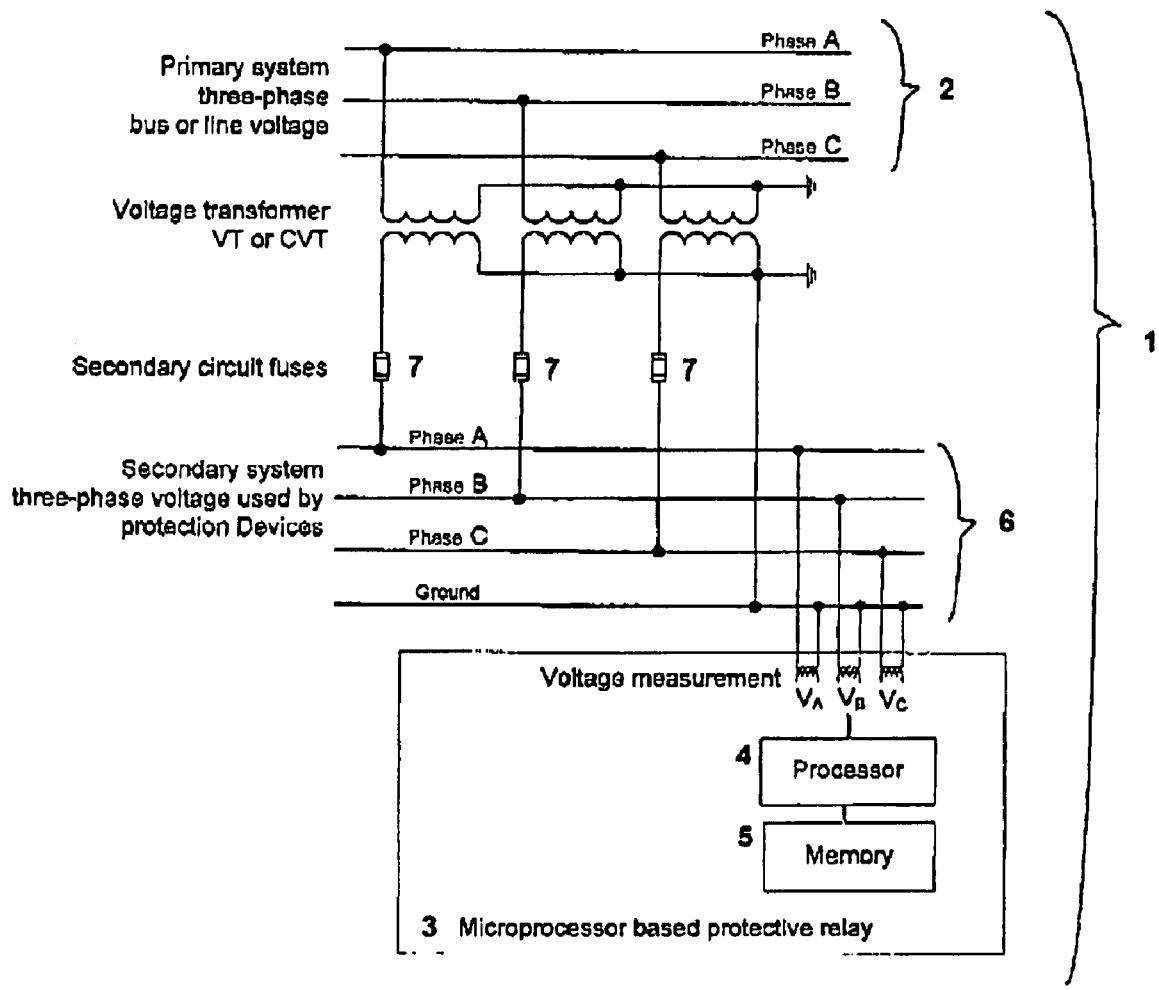
FIG. 1 illustrates an example of a power system wherein a three-phase protective relay is operatively connected to a three-phase bus or line voltage.

FIG. 1 illustrates a power system apparatus, globally indicated with reference number 1, wherein a primary three-phase power line (or bus) 2 is operatively connected to a protective device 3, preferably a computing device. Such a protective computing device 3 can be constituted for example by any suitable electronic relay.

The protective relay 3 comprises a microprocessor unit 4 with a program code which is embedded therein and is suitable to carry out the method of the present invention, and a memory unit 5 which can be directly incorporated within or operatively connected with the microprocessor unit 4 itself. The protective relay 3 is operatively connected to the phases of the power line, i.e. phase A, phase B and phase C, through voltage transformers (VT) that step down the primary system quantities to values that enable practical and safe implementation of the relay 3 itself. Some equivalent alternatives may be adopted for the connection, for example current transformers can be used in addition with or in alternative to voltage transformers VT. The secondary system circuit indicated at 6, which is normally used by protective devices, such as the relay 3, for their measures and appropriate operations, is suitably fused by means of secondary circuit fuses 7 in order to protect the voltage transformer secondary winding and circuit.

Figure 2:
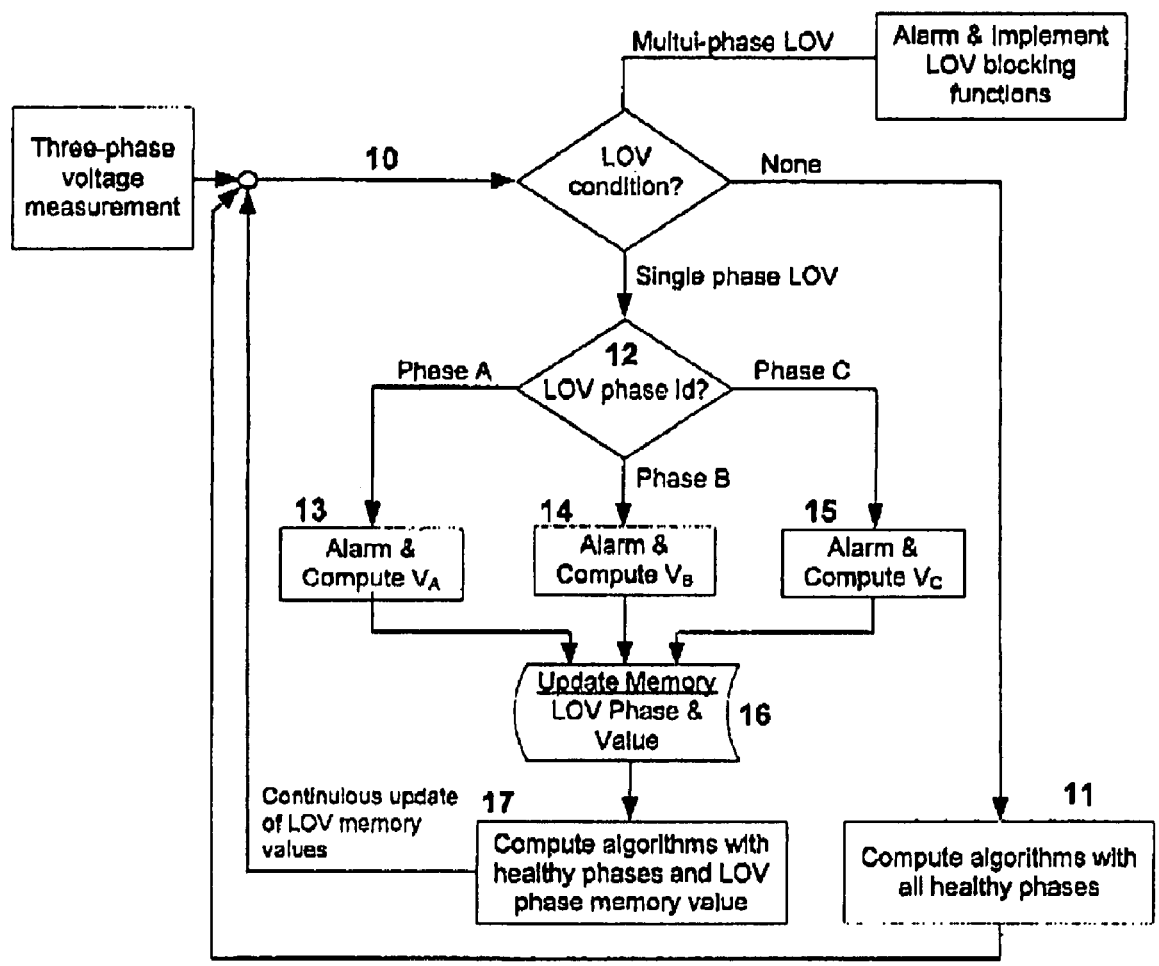
FIG. 2 is an operational block diagram schematically representing an embodiment of the method according to the present invention.

Referring now also to FIG. 2, the relay 3 receives the voltage signals 10 from the phases and, under normal operating conditions, i.e. an LOV state is not occurring, the microprocessor unit 4 computes at block 11 the respective voltage values (VA for phase A, VB for phase B, VC for phase C). These values are recorded in the memory unit 5 and are continuously updated by repetitive calculations.

When an LOV state occurs on one phase, for example because a fuse 7 blows due to a fault on the secondary circuit 6, the relay 3 through its microprocessor unit 4 first identifies (block 12) which phase is under an LOV-state. One possible manner suitable for the identification of the phase under an LOV-state is disclosed for example in U.S. Pat. No. 5,883,578 whose disclosure is fully incorporated herein by reference.

Once the phase under an LOV state is identified, the microprocessor unit 4 alarms and calculates (at block 13 for phase A, at block 14 for phase B, at block 15 for phase C) a fictitious voltage which is representative of the voltage of the phase in an LOV state. The fictitious voltage is recorded (block 16) in the memory unit 5 and is continuously updated by repetitive calculations.

Then, a reference polarizing voltage is calculated. This reference polarizing voltage can be used by the relay 3 and its incorporated logic/functions or it can be provided to any protection unit operatively associated with or incorporated in the multi-phase power system, so as to allow an improved operation reliability under some operating conditions, namely occurrence of a fault on one of the other phases, e.g. either phase A or C, which are not subject to a LOV state. Suitable protection units can be for example a unit for monitoring, supervising, detecting, tripping etc.

In the method according to the invention, the step of calculating said reference polarizing voltage can be carried out either by means of zero voltage sequence calculations or of negative voltage sequence calculations, and in particular the following equations can be used:

$3V_0 = V_A + V_B + V_C = 0$ \hfill Zero Sequence $3V_2 = V_A + a^2 V_B + a V_C = 0$ \hfill Negative Sequence where a is a complex operator $$\left(a = e^{j2\frac{\pi}{3}}\right)$$

and $V_A$, $V_B$ and $V_C$ are pre-fault voltages during an LOV state and with the assumption that with a perfectly balanced three-phase system $V_0$ (zero sequence) and $V_2$ (negative sequence) are equal to zero.

For perfectly balanced systems the results using either the zero or the negative sequence voltage equation would be substantially equal; however, there might be some differences if some unbalance exists. In these cases, a purposive selection can be done; for example, the voltage of the lost phase can be preferably calculated by using the zero sequence equation, e.g. for zero sequence directional polarization, and the computation using the negative sequence equation could be preferably used, e.g. for negative sequence directional polarization.

Hence, according to the method of the present invention, when an LOV state occurs on a phase, the above mentioned fictitious voltage representative of the LOV-state phase (VA' when the LOV is on phase A, or VB' when the LOV is on phase B, or VC' when the LOV is on phase C) is calculated based on the recorded voltages ($V_A$ and $V_B$ when the LOV is on phase C, or $V_A$ and $V_C$ when the LOV is on phase B, or $V_B$ and $V_C$ when the LOV is on phase A) of the other phases in a non-LOV state; in particular the following equations are used for these calculations:

LOV on Phase A $$V_A' = -(V_B + V_C)$$

$$V_A' = -(a^2 V_B + a V_C)$$

LOV on Phase B $$V_B' = -(V_A + V_C)$$

$$V_B' = \frac{-(V_A + aV_C)}{a^2}$$

LOV on Phase C $$V_C' = -(V_A + V_B)$$

$$V_C' = \frac{-(V_A + a^2 V_B)}{a}$$

The calculated fictitious representative voltage(s) ($V_{A'}$, or $V_{B'}$, or $V_{C'}$) are advantageously recorded in the memory unit 5 (block 16 of FIG. 2) and continuously updated.

Preferably, it is assumed that there is no significant phase angle shift for single-line-to-ground-faults of the non-faulted phase voltages between the pre-fault and fault states. This is a function of system grounding and is expected on the effectively grounded transmission systems.

Therefore, during an LOV state with a fault occurring on one of the healthy phases, i.e. not in a LOV state, the reference polarizing voltage is computed (block 17 of FIG. 2) on the basis of the calculated fictitious voltage ($V_{A'}$, or $V_{B'}$, or $V_{C'}$) representative of the LOV-state phase and of the voltages measured on the other healthy phases during the fault. In particular the appropriate reference polarizing voltage may be computed as follows:

LOV on phase A, fault on phases B or C $$3V_0' = V_A' + V_b + V_c$$

$$3V_2' = V_A' + a^2 V_b + a V_c$$

LOV on phase B, fault on phases A or C $$3V_0' = V_a + V_B' + V_c$$

$$3V_2' = V_a + a^2 V_B' + a V_c$$

LOV on phase C, fault on phases A or B $$3V_0' = V_a + V_b + V_C'$$

$$3V_2' = V_a + a^2 V_b + a V_C'$$

where $V_a$, $V_b$ and $V_c$ are the respective healthy phase voltages during the fault and $V_A'$, $V_B'$ and $V_C'$ are the respective computed pre-fault and fault phase memory voltages of the phase in the LOV state.

The method according to the invention can be helpful even in the worst condition where the LOV state condition and a fault condition occur both on the same phase. In this case, the measurement is significantly reduced or near zero and in the present method the fictitious LOV phase voltage is assumed equal to zero. As it will be demonstrated in more details in the example which follows, the standard calculation for $3V_0$ and $3V_2$ without the computed memory phase voltage will be still valid for the purpose of obtaining useful information about the direction of the fault.

Accordingly, for the conditions described directly above:

LOV and fault on phase A:

$$3V_0' = V_b + V_c$$

$$3V_2' = a^2 V_b + a V_c$$

LOV and fault on phase B:

$$3V_0' = V_a + V_c$$

$$3V_2' = V_a + a V_c$$

LOV and fault on phase C:

$$3V_0' = V_a + V_b$$

$$3V_2' = V_a + a^2 V_b$$

There will be now described an example comparing the values registered in a practical test and those calculated according to the method of the present invention.

The following example is based on pre-fault and fault quantities recorded for a forward fault at a remote bus. The related fault oscillography is displayed in FIG. 3 and the voltage and current secondary values are shown in Table A below.

TABLE A

Figure 3:
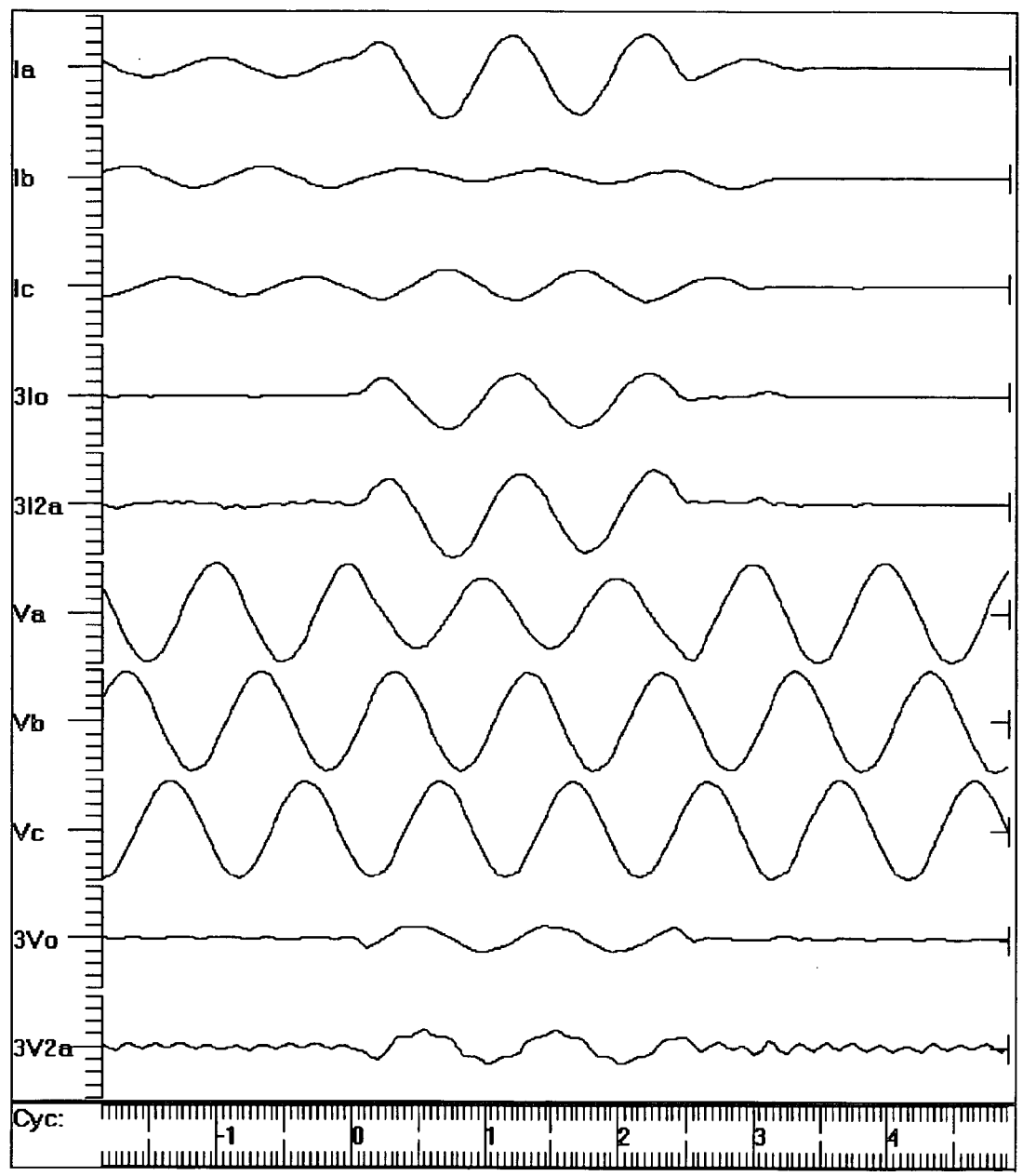
FIG. 3 shows a fault oscillography for a practical test based on pre-fault and fault quantities recorded for a forward fault at a remote bus.

Secondary Pre-fault and Fault Quantities for the Fault of FIG. 3

| Pre-fault | Magnitude | Angle | | Magnitude | Angle |
|---|---|---|---|---|---|
| $V_A$ | 66.87 | 359 | $I_A$ | 2.16 | 358 |
| $V_B$ | 66.94 | 238 | $I_B$ | 2.40 | 232 |
| $V_C$ | 66.34 | 118 | $I_C$ | 2.16 | 108 |
| $3V_0$ | 0.73 | 21 | $3I_0$ | 0.08 | 66 |
| $3V_2$ | 1.34 | 98 | $3I_2$ | 0.56 | 111 |

| Fault | Magnitude | Angle | | Magnitude | Angle |
|---|---|---|---|---|---|
| $V_a$ | 47.4 | 0 | $I_a$ | 8.98 | 285 |
| $V_b$ | 66.55 | 239 | $I_b$ | 1.48 | 205 |
| $V_c$ | 64.88 | 117 | $I_c$ | 3.35 | 96 |
| $3V_0$ | 16.93 | 177 | $3I_0$ | 5.99 | 277 |
| $3V_2$ | 20.01 | 169 | $3I_2$ | 9.15 | 269 |

As can be inferred from Table A and FIG. 3, the fault can be identified as a single phase A-to-ground fault based on current values. However, there appears to be some involvement with phase C based on the current on phase C during the fault and the fact that the negative sequence current, $3I_2$, is considerably larger than the zero sequence current, $3I_0$, since the two sequence currents would normally be equal for a single phase-to-ground fault.

For this example, an LOV state will be applied to each phase by setting that phase voltage to zero. Then using the above equations, both the zero and negative sequence polarizing voltages used during the LOV period will be computed and compared with the original values recorded.

LOV on phase A
  Zero Sequence Polarizing Voltage $$3V_0' = V_b + V_c$$

$$3V_0' = 66.55 e^{j239} + 64.88 e^{j117}$$

$$3V_0' = 63.73 e^{j179}$$

Negative Sequence Polarizing Voltage $3V_2' = a^2V_b + aV_c$ $3V_2' = e^{j240} \cdot 66.55 e^{j239} + e^{j120} \cdot 64.88 e^{j117}$ $3V_2' = 68.1 e^{j177}$ LOV on Phase B
Zero Sequence Polarization Voltage $V_B' = -(V_A + V_C)$ $V_B' = -(66.87 e^{j359} + 66.34 e^{j118})$ $V_B' = 67.7 e^{j238}$ $3V_0' = V_a + V_B' + V_c$ $3V_0' = 47.4 + 67.7 e^{j238} + 64.88 e^{j117}$ $3V_0' = 17.92 e^{j179}$ Negative Sequence Polarizing Voltage $V_B' = \dfrac{-(V_A + aV_C)}{a^2}$ $V_B' = \dfrac{-(66.87 e^{j359} + e^{j120} \cdot 66.34 e^{j118})}{e^{j240}}$ $V_B' = 66.62 e^{j240}$ $3V_2' = V_a + a^2 V_B' + aV_c$ $3V_2' = 47.4 + e^{j240} \cdot 66.62 e^{j240} + e^{j120} \cdot 64.88 e^{j117}$ $3V_2' = 21.5 e^{j171}$ LOV on Phase C
Zero Sequence Polarization Voltage $V_C' = -(V_A + V_B)$ $V_C' = -(66.87 e^{j359} + 66.94 e^{j238})$ $V_C' = 65.9 e^{j118}$ $3V_0' = V_a + V_b + V_C'$ $3V_0' = 47.4 + 66.55 e^{j239} + 65.9 e^{j118}$ $3V_0' = 18.29 e^{j177}$ Negative Sequence Polarization Voltage $V_C' = \dfrac{-(V_A + a^2 V_B)}{a}$ $V_C' = \dfrac{-(66.87 e^{j359} + e^{j240} \cdot 66.94 e^{j238})}{e^{j120}}$ $V_C' = 67.63 e^{j119}$ $3V_2' = V_a + a^2 V_b + aV$ $3V_2' = 47.4 + e^{j240} \cdot 66.55 e^{j239} + ej120 \cdot 67.63 e^{j119}$ $3V_2' = 19.69 e^{j179}$ Table B below shows the results comparing the actual polarizing voltages, $3V_0$ and $3V_2$, with the computed polarizing voltages, $3V_0'$ and $3V_2'$, using the LOV memory phase voltages, $V_A'$, $V_B'$ or $V_C'$.

TABLE B

Comparison of Actual and LOV Computed Polarizing Voltages

| Polarizing Voltage | No LOV (Actual Results) | Simulated LOV on Phase | | |
|---|---|---|---|---|
| | | A | B | C |
| 3V0 | $16.93 e^{j177}$ | $63.73 e^{j179}$ | $17.92 e^{j179}$ | $18.29 e^{j177}$ |
| 3V2 | $20.01 e^{j169}$ | $68.1 e^{j177}$ | $21.5 e^{j171}$ | $19.69 e^{j179}$ |

It can be observed that there is very little difference when the LOV state is on a non-faulted phase, B or C. When the fault occurs on the LOV phase A then the polarizing voltage magnitude is substantially greater, but the polarizing voltage angle, which is the quantity used for polarization, is still accurate enough to achieve proper directional sensing for this fault.

It is also noted that for this case the fault was not a true single phase-to-ground fault, but the analysis shows that correct operation for the LOV state will occur with this adaptive approach.

Hence, as evident from the above example, the operational reliability of protection units can be significantly improved while protection is in an LOV state by using the method according to the invention.

Likewise, in order to compute ground distance measurement during a single-phase LOV state, the voltage on the lost phase of the secondary circuit can be calculated in the same manner as done for the directional units using the method according to the invention and in particular, the zero and negative sequence voltage equations.

For example, in the case of cross-polarized ground distance measurement units, the operating principal is based on comparing the phase relationship of two phasor quantities, according to the following equations:

$V_{OP} = V_{XG} - \left[ I_X + \left( \dfrac{Z_{0L} - Z_{1L}}{Z_{1L}} \right) I_O \right] Z_C \quad X = A, B, C \quad \text{(faulted phase)}$ $V_{POL} = jV_{YZ} \quad\quad YZ = BC, CA, AB \quad \text{(phase-to-phase)}$ Where
$V_{OP}$=Operating voltage
$V_{POL}$=Polarizing voltage
$V_{XG}$=Faulted phase-to-ground voltage
$V_{YX}$=Cross Phase-to-phase voltage
$I_X$=Faulted phase current
$I_0$=Zero sequence current
$Z_1$=Positive sequence line impedance
$Z_0$=Zero sequence line impedance
$Z_C$=Distance reach setting, ohms
Trip occurs when $V_{OP}$ leads $V_{POL}$.

It can be easily observed that the polarizing voltage $V_{POL}$ will be in error if either of the two non-faulted phases is in an LOV state, and the distance unit would not operate accurately. In this case the reference polarizing voltage, $V_{POL}$, can be also computed according to the present method and in particular by using the LOV phase memory voltage, as per the following equations:

LOV on Phase A $V_A' = -(V_B + V_C)$ $V_{AB}' = V_A' - V_B$ C phase fault $V_{CA}' = V_C - V_A'$ B phase fault LOV on Phase B $V_B' = -(V_A + V_C)$ $V_{AB}' = V_A - V_B'$ C phase fault $V_{BC}' = V_B' - V_C$ A phase fault LOV on Phase C $V_C' = -(V_A + V_B)$ $V_{BC}' = V_B - V_C'$ A phase fault $V_{CA}' = V_C' - V_A$ B phase fault Thus, if the LOV state occurs on phase B and fault occurs on phase A or C, computation of the reference polarizing voltage is calculated based on the voltages Va and Vc recorded during the fault and on the memorized voltage $V_{B'}$.

It is obvious that the operating quantity, $V_{OP}$, cannot be computed with the similar pre-fault memory voltage because it is dependent on the accurate measurement of the phase-to-ground fault voltage, $V_{XG}$. In this case there are options that could be provided: block operation, force the unit to overreach, convert the unit to operate based on directional overcurrent with pre-set setting, etc.

Although the method of the present invention has been described with particular regard to directional units, it should be appreciated that it may be used with any other suitable voltage dependent protection unit, be it a measuring unit, or a detecting unit, or supervising unit, a tripping unit, etc. Further, it can be easily implemented with or within any suitable type or multi-phase power system or apparatus using a computing device, and as will be appreciated by one of skill in the art, it may be embodied as the method described, or as a system, or as a computer program product. Furthermore, the present invention may take the form of a computer program product on a computer-usable or computer-readable medium having computer-usable program code embodied in the medium. The computer-usable or computer-readable medium may be any medium that can contain, store, communicate, propagate, or transport the program for use by or in connection with the instruction execution system, apparatus, or device, etc. Non exhaustive examples of the computer-readable medium would include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code for carrying out operations of the present invention may be written in any suitable programming language, such as object oriented programming languages e.g. Java, Smalltalk, C++ or the like, or may also be written in more conventional procedural programming languages, such as the "C" programming language.

Hence, the present invention also deals with a computer program product for allowing reliable operation during a loss of a phase voltage (LOV) in a multi-phase power system. The computer program product comprises computer usable program code configured to:

identify the phase which is in an LOV state;

calculate a fictitious voltage representative of the voltage of said phase in an LOV state; and calculate a reference polarizing voltage.

The present invention also encompasses a multi-phase power system for allowing operational reliability during a loss of a phase voltage (LOV), comprising a computing device having therein program code usable by the computing device itself, wherein the program code comprises code configured to:

identify the phase which is in an LOV state;

calculate a fictitious voltage representative of the voltage of said phase in an LOV state; and calculate a reference polarizing voltage.

The program code residing in the computing device or usable as or with the above indicated program product is preferably configured so as to calculate the reference polarizing voltage either by means of zero voltage sequence calculations or of negative voltage sequence calculations. In particular, the program code is configured to calculate the fictitious voltage on the basis of the voltages of the phases other than said phase in an LOV-state. Further, the program code is configured in such a way that, when a fault occur on one of the phases other than the phase in an LOV-state, the calculation of the reference polarizing voltage is carried out on the basis of: the pre-calculated fictitious voltage representative of the voltage of the phase in an LOV state; and of the voltages which are suitably detected during the fault on the phases other than the phase in an LOV-state. The program code preferably comprises code which is configured to assume the fictitious voltage representative of the voltage of said phase in an LOV state equal to zero when a fault occurs on the phase under an LOV-state, and/or to assume no significant phase angle shift for single-line-to-ground-faults between pre-fault and fault condition on the phases in a non-LOV-state.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A method for improving operational reliability during a loss of a phase voltage (LOV) in a multi-phase power system having a protection unit, the method comprising:

identifying the phase which is in an LOV state;

calculating a fictitious voltage representative of the voltage of said phase in an LOV state;

recording said fictitious voltage;

calculating a reference polarizing voltage, wherein, when a fault occurs on one of said phases other than the phase in an LOV-state, said reference polarizing voltage is calculated on the basis of the fictitious voltage and of the voltages measured during the fault on said phases other than the phase in an LOV-state; and providing the polarizing voltage to the protection unit.

2. The method of claim 1, wherein said reference polarizing voltage is calculated by means of zero voltage sequence calculations.

3. The method of claim 1, wherein said reference polarizing voltage is calculated by means of negative voltage sequence calculations.

4. The method of claim 1, further comprising:

recording the voltages of the phases during normal operating conditions.

5. The method of claim 4, wherein said fictitious voltage is calculated on the basis of the recorded voltages of the phases other than said phase in an LOV-state.

6. The method of claim 1 wherein, when a fault occurs on the phase which is in an LOV state, further comprises:
assuming said fictitious voltage representative of the voltage of said phase in an LOV state equal to zero.

7. The method of claim 1, further comprising:
assuming no significant phase angle shift between pre-fault and fault condition on the phases in a non-LOV-state.

8. A computer program product for allowing reliable operation during the loss of a phase voltage (LOV) in a multi-phase power system having a protection unit, said computer program product comprising computer usable program code stored on computer readable media and when executed by a processor is configured to:
identify the phase which is in an LOV state;
calculate a fictitious voltage representative of the voltage of said phase in an LOV state;
calculate a reference polarizing voltage, wherein said reference polarizing voltage is calculated on the basis of said fictitious voltage and of the voltages measured during the fault on said phases other than the phase in an LOV-state, when a fault occurs on one of said phases other than the phase in an LOV-state; and
provide said reference polarizing voltage to the protection unit.

9. A computer program product according to claim 8, wherein said computer usable program code is configured to calculate said reference polarizing voltage by means of zero voltage sequence calculations.

10. A computer program product according to claim 8, wherein said computer usable program code is configured to calculate said reference polarizing voltage by means of negative voltage sequence calculations.

11. A computer program product according to claim 8, wherein said computer usable program code is configured to calculate said fictitious voltage the basis of the recorded voltages of the phases other than said phase in an LOV-state.

12. A computer program product according to claim 8, wherein said computer usable program code comprises code configured to assume said fictitious voltage equals zero when a fault occurs on the phase which is in an LOV state.

13. A computer program product according to claim 8, wherein said computer usable program code comprises code configured to assume no significant phase angle shift between pre-fault and fault condition on the phases in a non-LOV-state.

14. A multi-phase power system for allowing operational reliability during a loss of a phase voltage (LOV), comprising a protection unit and program code stored on computer readable media that, when executed by a processor, is configured to:
identify the phase which is in an LOV state;
calculate a fictitious voltage representative of the voltage of said phase in an LOV state;
calculate a reference polarizing voltage, wherein said program code is configured to calculate said reference polarizing voltage on the basis of said fictitious voltage and of the voltages measured during the fault on said phases other than the phase in an LOV-state, when a fault occurs on one of said phases other than the phase in an LOV-state, and
provide said reference polarizing voltage to the protection unit.

15. A multi-phase power system according to claim 14, wherein said program code is configured to calculate said reference polarizing voltage by means of zero voltage sequence calculations.

16. A multi-phase power system according to claim 14, wherein said program code is configured to calculate said reference polarizing voltage by means of negative voltage sequence calculations.

17. A multi-phase power system according to claim 14, wherein said program code is configured to calculate said fictitious voltage on the basis of the recorded voltages of the phases other than said phase in an LOV-state.

18. A multi-phase power system according to claim 14, wherein said program code comprises code configured to assume said fictitious voltage equals zero when a fault occurs on the phase which is in an LOV state.

19. A multi-phase power system according to claim 14, wherein said program code comprises code configured to assume no significant phase angle shift between pre-fault and fault condition on the phases in a non-LOV-state.

* * * * *